US005184035A

United States Patent [19]
Sugibayashi

[11] Patent Number: 5,184,035
[45] Date of Patent: Feb. 2, 1993

[54] BOOTSTRAP CIRCUIT INCORPORATED IN SEMICONDUCTOR MEMORY DEVICE FOR DRIVING WORD LINES

[75] Inventor: Tadahiko Sugibayashi, Tokyo, Japan

[73] Assignee: NEC Corporation, Tokyo, Japan

[21] Appl. No.: 696,961

[22] Filed: May 8, 1991

[30] Foreign Application Priority Data

May 11, 1990 [JP] Japan .................. 2-121752

[51] Int. Cl.$^5$ .......................................... H03K 19/01
[52] U.S. Cl. ...................................... 307/482; 307/443; 307/453; 307/578
[58] Field of Search ................ 307/482, 443, 453, 578

[56] References Cited

U.S. PATENT DOCUMENTS

| 4,617,476 | 10/1986 | Dalrymple | 307/482 |
| 4,617,476 | 2/1986 | Redfield | 307/482 |
| 5,073,731 | 12/1991 | Oh | 307/482 |

Primary Examiner—Eugene R. LaRoche
Assistant Examiner—R. A. Ratliff
Attorney, Agent, or Firm—Leydig, Voit & Mayer

[57] ABSTRACT

A bootstrap circuit with a word line of a semiconductor memory device comprises a bootstrap unit having a bootstrap capacitor coupled at one electrode thereof to an output node and supplied from an input node with an input signal, and responsive to a booting signal of a power voltage level supplied to the other electrode of the bootstrap capacitor for bootstrapping an output voltage at the output node over the power voltage to a first predetermined level in cooperation with a load capacitor; a constant voltage source operative to produce a second predetermined voltage level higher than the low voltage level and lower than the booting signal; and a switching unit operative to supply the booting signal to the other electrode in the presence of the input signal and to feed the second predetermined voltage level to the other electrode in the absence of the input signal, wherein the other electrode of the bootstrap capacitor varies the voltage level between the power voltage level and the second predetermined voltage level so that the output node is saturated at the first predetermined voltage level through the bootstrapping phenomenon only.

19 Claims, 7 Drawing Sheets

BOOTSTRAP CIRCUIT INCORPORATED IN SEMICONDUCTOR MEMORY DEVICE FOR DRIVING WORD LINES

FIELD OF THE INVENTION

This invention relates to a semiconductor memory device and, more particularly, to a bootstrap circuit incorporated in the semiconductor memory device for driving word lines.

DESCRIPTION OF THE RELATED ART

Upon access to a data bit, a dynamic random access memory device allows switching transistors of memory cells to concurrently turn on with a word line for coupling the storage capacitors to respective bit lines, and a word line driver circuit boosts the word line over a power voltage level so as to enhance the conductivity of current paths between the storage capacitors and the associated bit lines.

A typical example of the bootstrap circuit incorporated in the dynamic random access memory device is illustrated in FIG. 1 and comprises a series combination of three inverting circuits IN1, IN2 and IN3 coupled between an input node N0 and an n-channel type field effect transistor Qn1, a series combination of a delay circuit DL1, an inverting circuit IN4 and a bootstrap capacitor C1 coupled between an intermediate node N1 and an output node N2, a charge pump circuit 1 coupled to the output node N2, a clamping circuit 2 coupled to the output node N2, and a load capacitor C2 also coupled to the output node N2. The clamping circuit 2 comprises two n-channel type field effect transistors Qn2 and Qn3 coupled in series, and each of the n-channel type field effect transistors Qn2 and Qn3 has a gate electrode coupled to the drain node thereof. The input node and the output node of the inverting circuit IN4 are respectively labeled with N3 and N4.

The prior art bootstrap circuit thus arranged behaves as follows. Assuming now that an input signal Sin at the input node N0 is decayed, the voltage level at the intermediate node N1 follows the input signal Sin and is, accordingly, decayed from the power voltage level Vcc at time t1. The inverting circuit IN3 allows the output node N2 to start on rising at time t2, and the voltage level at the output node N2 reaches a voltage level lower than the power voltage level Vcc by the threshold level Vth of the n-channel type field effect transistor Qn1. The delay circuit DL1 introduces time delay into propagation of voltage level from the intermediate node N1 to the input node N3 of the inverting circuit IN4, and, for this reason, the voltage level at the input node N3 of the inverting circuit IN4 starts on decay at time t3. The inverting circuit IN4 allows the voltage level at the output node N4 to start on rising at time t4, and the output node N2 is boosted over the power voltage level Vcc through the bootstrapping of the capacitor C1 cooperating with the load capacitor C2 without any substantial time delay from time t4. The output node N2 reaches a higher voltage level Vh than the power voltage level Vcc at time t5, and the higher voltage level Vh is given as $$Vh = (2C1 + C2) \times Vcc/(C1 + C2) - Vth$$

where C1 and C2 are respective capacitances of the capacitors C1 and C2.

If no clamping circuit is coupled to the output node N2, the voltage level at the output node N2 traces broken lines BL until the input signal Sin decays the voltage level at the intermediate node N1. However, the switching transistors of memory cells (not shown) usually have extremely thin gate oxide films, and the higher voltage level Vh is not desirable for the extremely thin gate oxide films. For this reason, the clamping circuit 2 restricts the voltage level at the output node N2 in a high voltage level Vh' between the power voltage level and the higher voltage level Vh, and the voltage level at the output node N2 traces real line RL instead of the broken lines BL. While decaying the voltage level at the output node N2, the clamping circuit 2 discharges the current from the output node N2 as useless charges. While the output node N2 remains in the higher and high voltage levels Vh and Vh', the associated word line allows the switching transistors (not shown) to turn on, and the storage capacitors are coupled to associated bit lines (not shown).

The voltage level at the output node N2 starts on decay at time t6 and is recovered to the low voltage level for blocking the storage capacitors from the associated bit lines.

Since the voltage level at the output node N2 tends to be decayed due to leakage current, the charge pump unit 1 supplements electric charges and keeps the voltage level at the output node N2 constant until the input signal Sin allows decaying.

If the n-channel type field effect transistors Qn2 and Qn3 are small in size and, accordingly, in current discharging capability, the voltage level at the output node N2 is slowly decayed from the higher voltage level Vh, and most of the time period between time t5 and time t6 exceeds the high voltage level Vh'. This results in that the extremely thin gate oxide films are liable to be damaged, and the clamping circuit 2 is useless.

If, on the other hand, the n-channel type field effect transistors Qn2 and Qn3 are large in size and, accordingly, in current discharging capability, the output node N2 rapidly reaches the high voltage level Vh'. However, the clamping circuit 2 discards the electric charges accumulated in the bootstrap capacitor C1, and the current consumption is increased. Thus, there is a trade-off between the protection of the extremely thin gate oxide films and the current consumption, and the problems are inherent in the prior art bootstrap circuit incorporated in the random access memory device.

SUMMARY OF THE INVENTION

It is therefore an important object of the present invention to provide a bootstrap circuit which is free from the problems inherent in the prior art bootstrap circuit.

To accomplish the object, the present invention proposes to decrease variation of voltage level at one of the electrodes of a bootstrap capacitor in the presence of an input signal and in the absence of the input signal.

In accordance with the present invention, there is provided a bootstrap circuit comprising an input node, an output node, a bootstrap unit, a constant voltage source, and a switching unit. The input node receives an input signal and remains in a low voltage level in the absence of the input signal. The bootstrap unit is supplied from the input node with the input signal and includes a bootstrap capacitor having first and second electrodes, the first electrode being coupled to the output node. The bootstrap unit further includes a load capacitor coupled to the output node. The bootstrap unit is responsive to a booting signal supplied to the second electrode of the bootstrap capacitor for bootstrapping an output voltage at the output node over a power voltage to a first predetermined level. The constant voltage source is operative to produce a second predetermined voltage level higher than the low voltage level and lower than the booting signal. The switching unit is coupled to the constant voltage source and to the bootstrap unit. The switching unit is operative to supply the booting signal to the second electrode of the bootstrap capacitor in the presence of the input signal and to feed the second predetermined voltage level to the second electrode of the bootstrap capacitor in the absence of the input signal.

BRIEF DESCRIPTION OF THE DRAWINGS

The features and advantages of the bootstrap circuit according to the present invention will be more clearly understood from the following description taken in conjunction with the accompanying drawings in which.

DESCRIPTION OF THE PREFERRED EMBODIMENTS

First Embodiment

Figure 3:
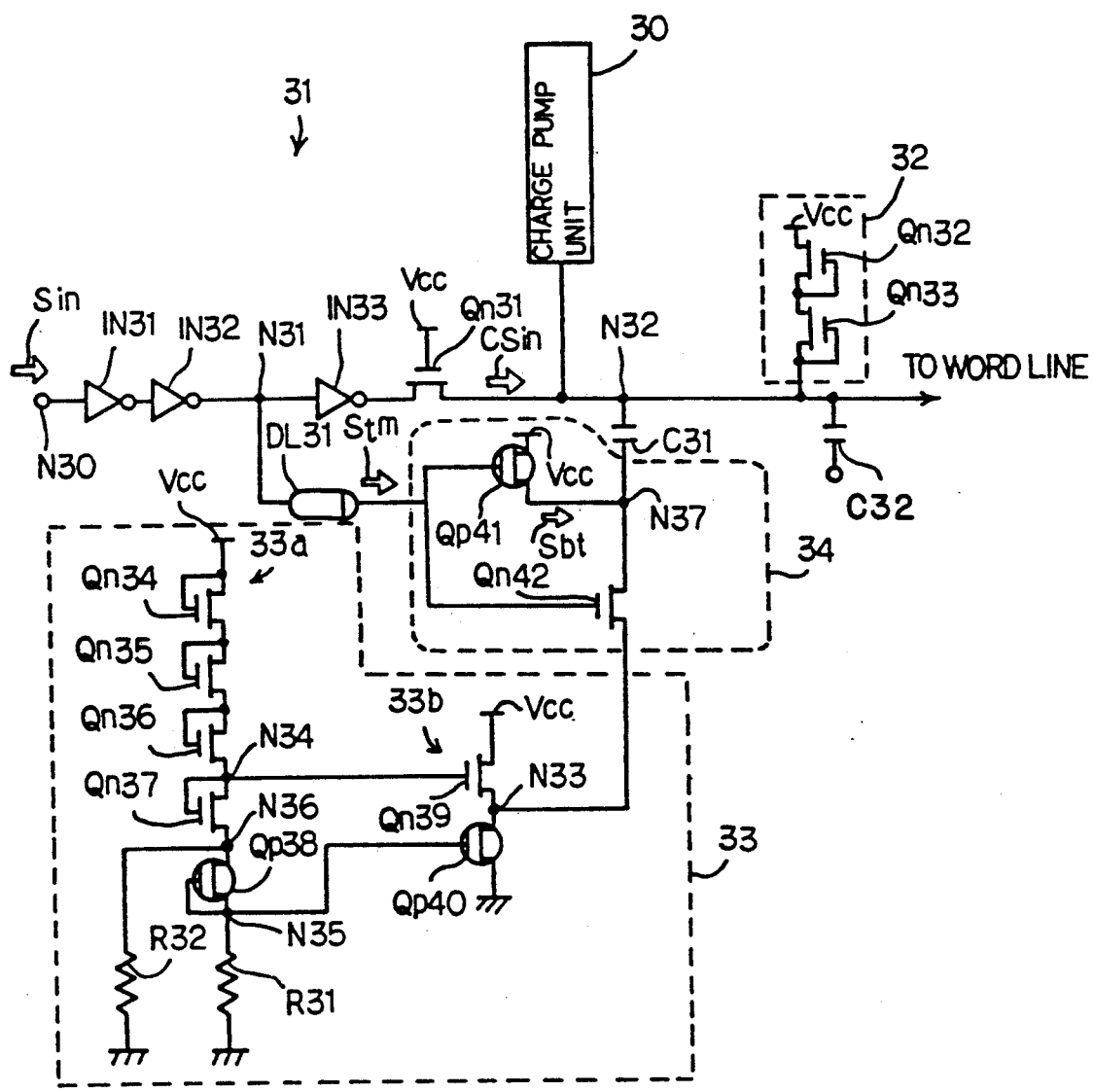
FIG. 3 is a circuit diagram showing the arrangement of a bootstrap circuit according to the present invention.

Referring to FIG. 3 of the drawings, a bootstrap circuit embodying the present invention is illustrated. Though not shown in the drawings, the bootstrap circuit is coupled to a word line, and a plurality of memory cells are coupled to the word line. Upon access to a data bit stored in one of the memory cells, the bootstrap circuit drives the word line over a power voltage level, and the data bits stored in the memory cells are concurrently read out to associated bit lines.

The bootstrap circuit shown in FIG. 3 largely comprises a bootstrap unit 31, a clamping unit 32, a charge pump unit 30, a constant voltage level producing circuit 33, and a switching unit 34. The bootstrap unit 31 comprises an n-channel type field effect transistor Qn31, a series combination of three inverting circuits IN31, IN32 and IN33 coupled between an input node N30 and the n-channel type field effect transistor Qn31, a delay circuit DL31 coupled between an intermediate node N31 and the switching unit 34, a bootstrap capacitor C31 coupled between the switching unit 34 and an output node N32, and a lead capacitor C32. An input signal Sin of an active low voltage level is supplied to the input node N30, and is inverted twice through the inverting circuits IN31 and IN32. The inverting circuit IN32 supplies the input signal Sin to the inverting circuit IN33 as well as the delay circuit DL31, and the delay circuit DL31 introduces a time delay into propagation of the input signal Sin, thereby producing a timing signal Stm. The inverting circuit IN33 supplies a complementary input signal CSin of the input signal Sin through the n-channel type field effect transistor Qn31 to one of the electrodes of the bootstrap capacitor C31. Although the complementary input signal CSin is as high as the power voltage level Vcc to the n-channel type field effect transistor Qn31, the n-channel type field effect transistor Qn31 lowers the voltage level of the complementary input signal CSin by the threshold voltage level Vthn thereof. For this reason, the complementary input signal CSin thus lowered is supplied to one of the electrodes of the bootstrap capacitor C31, and accumulates the bootstrap capacitor C31.

When a booting signal Sbt is supplied from the switching unit 34 to the other electrode of the bootstrap capacitor C31, the bootstrap capacitor C31 boosts an output voltage level at the output node N32 in cooperation with the load capacitor C32. In this instance, the ratio of the capacitance of the bootstrap capacitor C31 to the capacitance of the load capacitor C32 is adjusted to 3:1, and the output voltage level is boosted to a first predetermined voltage level higher than the power voltage level by a certain value twice as large as the threshold level Vthn of the component n-channel type field effect transistor such as Qn31 as described hereinbelow. The bootstrap unit 31 is arranged to saturate the output voltage level at the first predetermined voltage level without any aid of the clamping unit 32, and the output voltage smoothly reaches the first predetermined voltage level at early stage of the driving operation of the associated word line.

Figure 1:
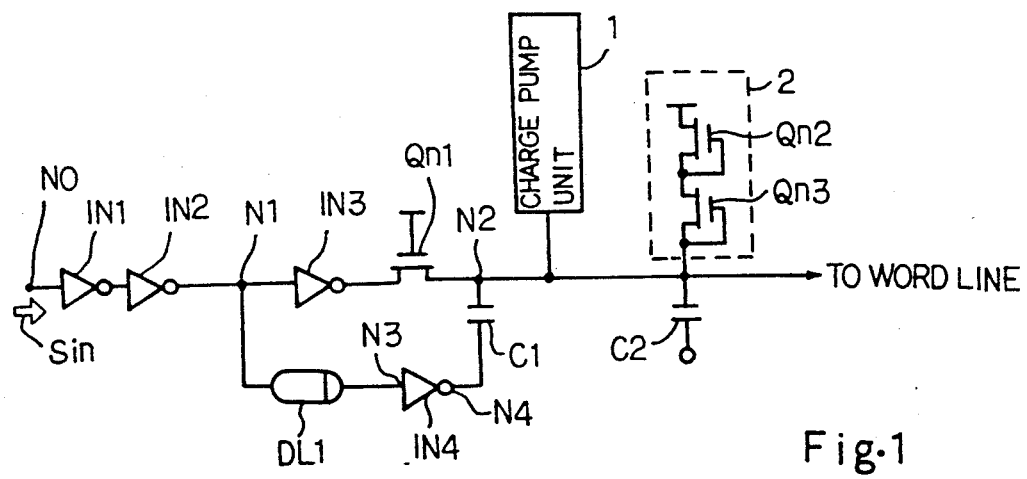
FIG. 1 is a circuit diagram showing the arrangement of the prior art bootstrap circuit incorporated in a random access memory device.
Figure 2:
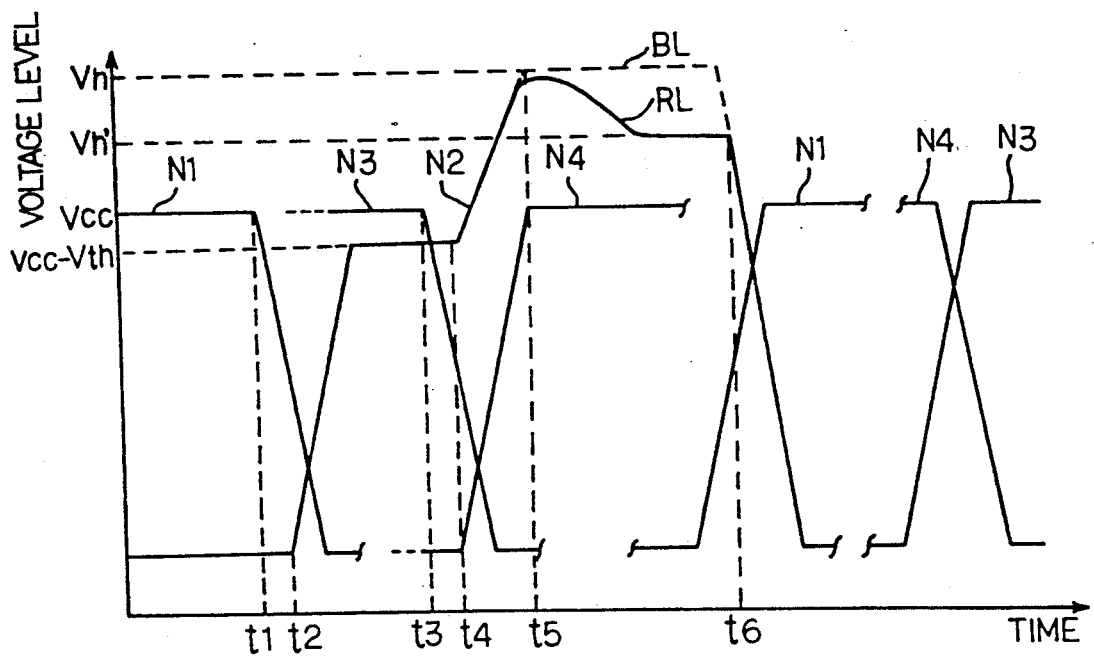
FIG. 2 is a diagram showing the waveforms of voltage levels at essential nodes in the prior art bootstrap circuit.

The clamping unit 32 comprises two n-channel type field effect transistors Qn32 and Qn33 coupled in series between a source of power voltage level Vcc and the output node N32, and each of the n-channel type field effect transistors Qn32 and Qn33 has a gate electrode coupled to the drain node thereof. The clamping unit 32 thus arranged discharges current from the output node N32 to the source of positive voltage level Vcc while the output voltage level at the output node N32 exceeds the first predetermined voltage level. If the output voltage level is decayed from the first predetermined voltage level due to, for example, leakage current from the associated word line, the charge pump unit 30 supplements current and, accordingly, keeps the output voltage level at the first predetermined level. The bootstrap circuit according to the present invention saturates the output voltage level around the first predetermined voltage level through the bootstrapping phenomenon, and the clamping circuit 32 is provided for canceling excess electric charges supplied from the charge pump unit 30 only. If no leakage current takes place, not only the charge pump unit 30 but also the clamping unit 32 may be deleted from the bootstrap circuit according to the present invention. The clamping unit 32 only cancels the excess electric charges, and, for this reason, the n-channel type field effect transistors Qn32 and Qn33 are extremely small in size. Moreover, since the clamping unit 32 merely discharges the excess electric charges, the current consumption of the bootstrap circuit is drastically improved rather than that of the prior art bootstrap circuit shown in FIG. 1.

Figure 4:
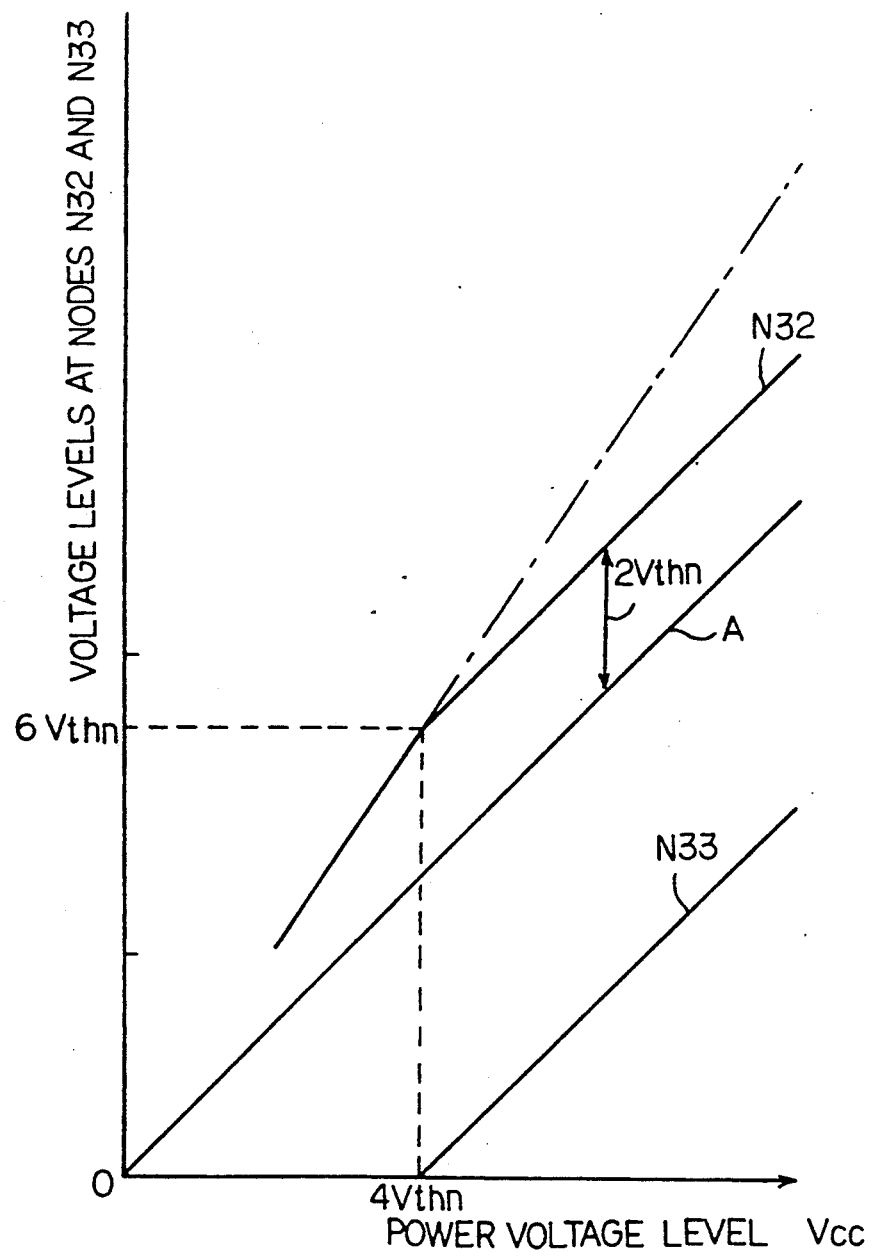
FIG. 4 is a graph showing relationship between a power voltage level and a second predetermined voltage level as well as the power voltage level and an output voltage level.

The constant voltage level producing unit 33 comprises a voltage divider 33a coupled between the source of power voltage level Vcc and a ground node, and a voltage level adjusting circuit 33b coupled between the source of power voltage level Vcc and the ground node for producing a second predetermined voltage level at a node N33. The voltage divider 33a comprises a series combination of n-channel type field effect transistors Qn34, Qn35, Qn36 and Qn37, a p-channel type field effect transistor Qp38 and a resister R31, and each of the field effect transistors Qn34 to Qn37 and Qn38 has a gate electrode coupled to the source node thereof. A first output node N34 is provided between the n-channel type field effect transistors Qn36 and Qn37, and a second output node N35 is between the p-channel type field effect transistor Qp38 and the resister R31. Between the common drain node N36 of the field effect transistors Qn37 and Qp38 and the ground node a resistor R32 is coupled, and first and second controlling signals take place at the nodes N34 and N35 with a predetermined difference voltage. The voltage level adjusting circuit 33b is implemented by a series combination of an n-channel type field effect transistor Qn39 and a p-channel type field effect transistor Qp40 coupled between the source of power voltage level Vcc and the ground node, and the field effect transistors Qn39 and Qp40 are gated by the first and second controlling signals, respectively. The first controlling signal is regulated by the three n-channel type field effect transistors Qn34 to Qn36, and the voltage level of the first controlling signal is as high as (Vcc−3Vthn). Similarly, the voltage node at the common drain node N36 is given as (Vcc−4Vthn), and the second controlling signal hardly exceeds a certain voltage level given as (Vcc−4Vthn−Vthp) where Vthp is the threshold level of the p-channel type field effect transistor Qp38. The n-channel type field effect transistor Qn39 lowers the power voltage level Vcc by 4Vthn, because the first controlling signal (Vcc−3Vth) is supplied to the gate electrode of the n-channel type field effect transistor Qn39. If the power voltage level Vcc is linearly increased as indicated by plots A of FIG. 4, the second predetermined voltage level at the node N33 starts on increasing from 4Vthn as indicated by plots N33, and the voltage difference as large as 4Vthn is kept between the power voltage level Vcc and the second predetermined voltage level.

The switching unit 34 is implemented by a series combination of a p-channel type field effect transistor Qp41 and an n-channel type field effect transistor Qn42 coupled between the source of positive voltage level and the node N33, and the timing signal Stm is supplied to the gate electrodes of the p-channel type field effect transistor Qp41 and the n-channel type field effect transistor Qn42. The common drain node 37 is coupled to the other electrode of the bootstrap capacitor C31, and selectively supplies the booting signal Sbt as high as the power voltage level or the second predetermined voltage level to the other electrode of the bootstrap capacitor C31.

Figure 5:
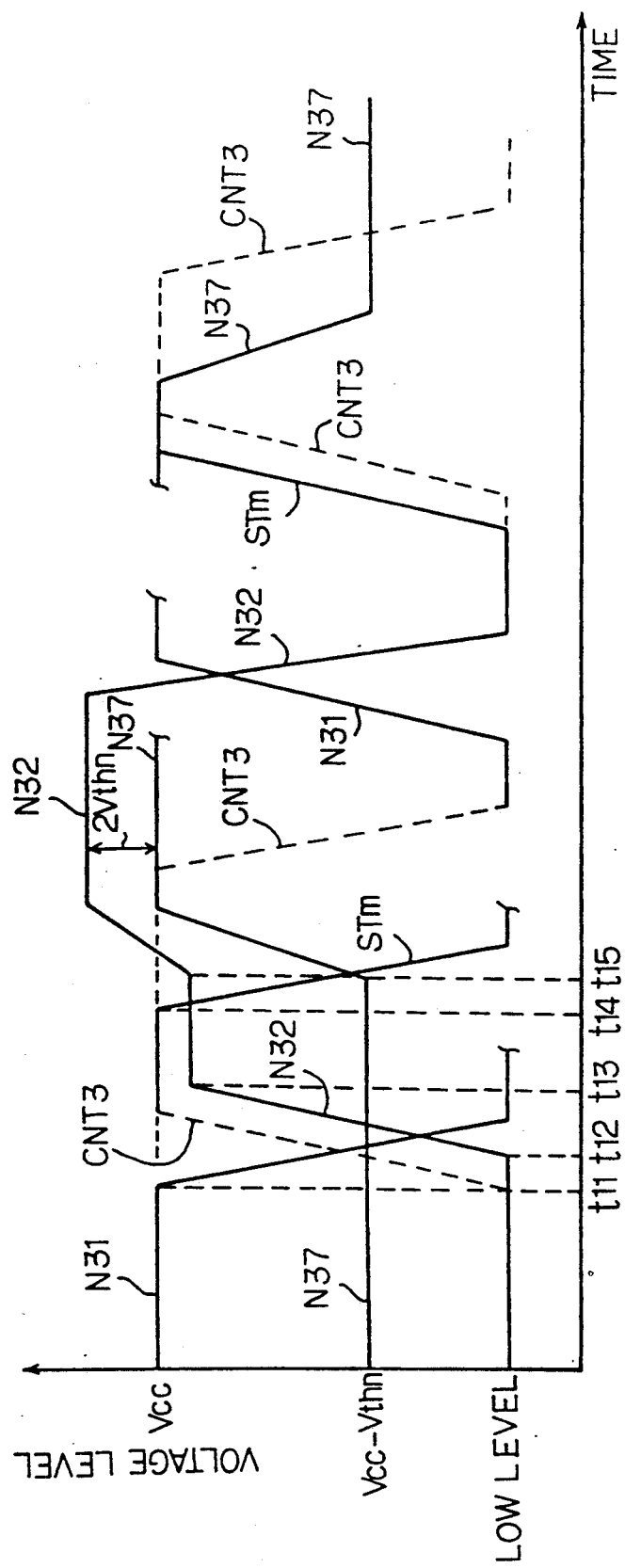
FIG. 5 is a diagram showing the waveforms of voltage levels at essential nodes in the bootstrap circuit shown in FIG. 3.

Description is hereinbelow made on the circuit behavior of the bootstrap circuit thus arranged with reference to FIG. 5 of the drawings. While the input signal Sin remains in an inactive high voltage level, the node N31 of the power voltage level allows the delay unit DL31 to supply the timing signal Stm of the power voltage level to the switching unit 34, and the p-channel type field effect transistor Qp41 is turned off. However, the n-channel type field effect transistor Qn42 is turned on to relay the second predetermined voltage level (Vcc−4Vthn) to the node N37, and the other electrode of the bootstrap capacitor C31 is supplied with the second predetermined voltage level.

If the input signal Sin goes down to the active low voltage level, the voltage level at the node N31 follows the input signal Sin and starts on decay at time t11. The inverting circuit IN33 causes the complementary input signal CSin to start on rising at time t12, and the output node N32 follows the complementary input signal CSin. The output node reaches the voltage level (Vcc−Vthn) at time t13.

The delay circuit DL31 allows the timing signal Stm to go down to the low level at time t14, and the n-channel type field effect transistor Qn42 turns off to block the node N37 from the second predetermined voltage level. However, the p-channel type field effect transistor Qp41 complementarily turns on to supply the booting signal Sbt of the power voltage level Vcc to the node N37. Then, the other electrode of the bootstrap capacitor C31 increases the voltage level from the second predetermined voltage level (Vcc−4Vthn) to the power voltage level Vcc, and the capacitors C31 and C32 adjusted to the aforesaid ratio allows the output node N32 to go up to the first predetermined voltage level (Vcc+2Vthn) without any assistance of the clamping unit 32. Thus, the output voltage level keeps the voltage difference twice as large as the threshold level Vthn as indicated by plots N32 of FIG. 4

Second Embodiment

Figure 6:
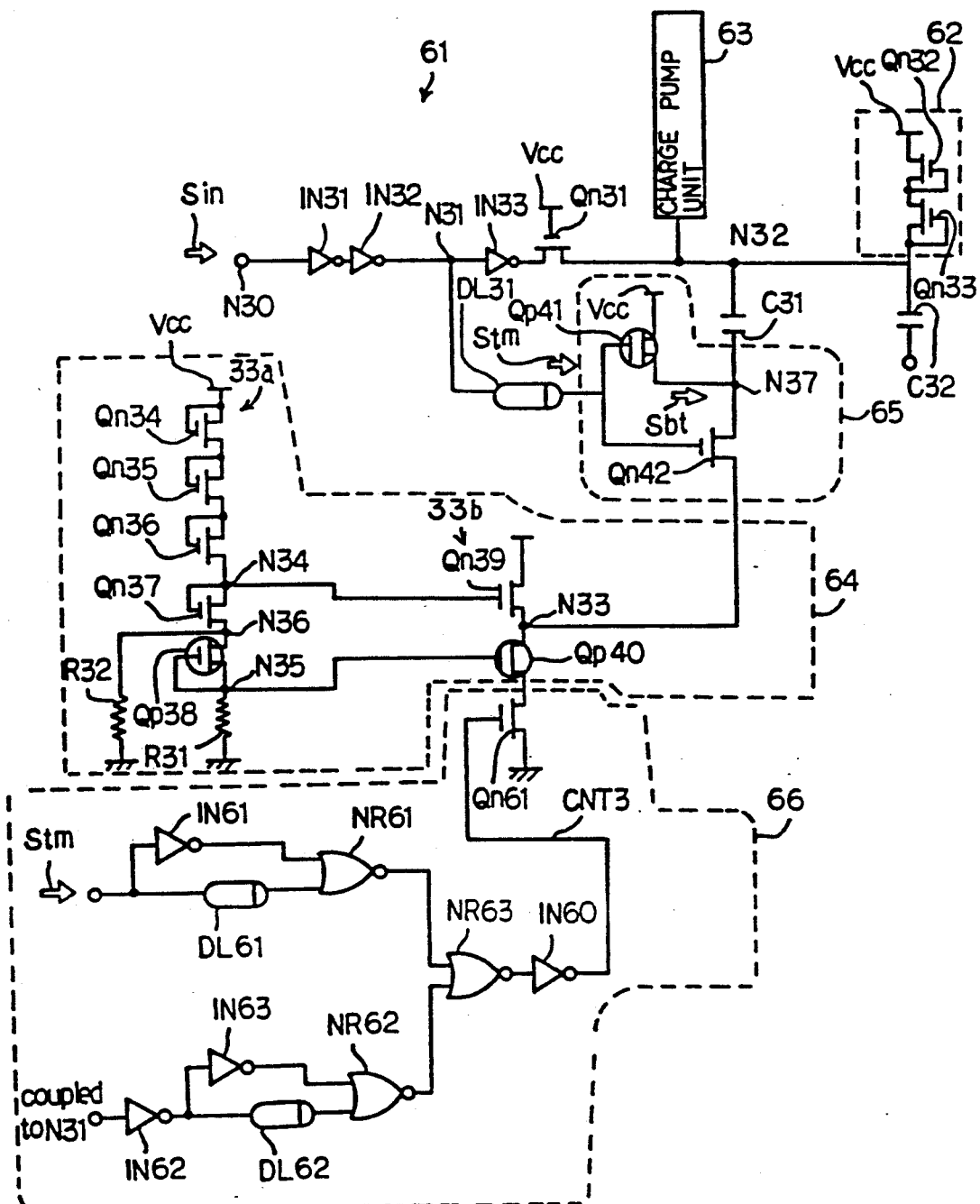
FIG. 6 is a circuit diagram showing the arrangement of another bootstrap circuit according to the present invention.

Turning to FIG. 6 of the drawings, another bootstrap circuit embodying the present invention largely comprises a bootstrap unit 61, a clamping unit 62, a charge pump unit 63, a constant voltage producing unit 64, a switching unit 65, and a controlling unit 66. The bootstrap unit 61, the clamping unit 62, the charge pump unit 63, the constant voltage producing unit 64 and the switching unit 65 are similar in arrangement to the corresponding units 31, 32, 30, 33 and 34 with the exception that a voltage level adjusting circuit 64b is coupled between the source of power voltage level Vcc and the controlling unit 66, and, for this reason, the component elements of those units 61 to 65 are labeled with the same references used in FIG. 3 without any detailed description.

The voltage level adjusting circuit 33b is coupled between the source of positive voltage level Vcc and an n-channel type field effect transistor Qn61 incorporated in the controlling unit 66. The controlling unit 66 further comprises three NOR gates NR61, NR62 and NR63 and an inverting circuit IN60, and the NOR gate NR61 and NR62 are coupled to the two input nodes of the NOR gate NR63. The NOR gate NR61 is associated with an inverting circuit IN61 and a delay circuit DL61, and the timing signal Stm is supplied to the inverting circuit IN61 and the delay circuit DL61. Similarly, the NOR gate NR62 is associated with inverting circuits IN62 and IN63 and a delay circuit DL62, and the voltage level at the node N31 is supplied to the inverting circuit IN62.

The power voltage level and the ground voltage level are assumed to be logic "1" level and logic "0" level, respectively, and both of the NOR gates NR61 and NR62 usually produce respective output signals of logic "0" level, because logic "1" level and logic "0" level are supplied to the input nodes of each NOR gate NR61 or NR62. In this situation, the NOR gate NR63 yields an output signal of logic "1" level, and the inverting circuit IN60 supplies a third controlling signal CNT3 of the ground voltage level to the gate electrode of the n-channel type field effect transistor Qn61. The n-channel type field effect transistor Qn61 remains off in so far as the voltage level at the node N31 is constant in either power or ground voltage level, and no current passes through the voltage level adjusting circuit 33b. This further improves the current consumption of the bootstrap circuit.

However, if the node N31 is decayed from the power voltage level to the ground voltage level, NOR gate NR62 shifts the output signal from logic "0" level to logic "1" level, because the delay circuit DL62 retards the voltage rising at the output node of the inverting circuit IN62 and keeps one of the output nodes in logic "0" level. On the other hand, the delay circuit DL31 allows the timing signal Stm to remaining at the power voltage level, and the NOR gate NR61 still produces the output signal of logic "0∞ level. With the output signal of logic "1" level and the output signal of logic "0" level, the NOR gate NR63 shifts the output signal from logic "1" level to logic "0" level, and the third controlling signal CNT3 goes up to the power voltage level Vcc. This results in that the n-channel type field effect transistor Qn61 to turn on, and current flows through the voltage level adjusting circuit 33b so that the second predetermined voltage level takes place at the node N33.

The delay circuit DL62 keeps one of the input nodes of the NOR gate NR62 in logic "0" level for a while, and, thereafter, shifts to logic "1" level. Even if the timing signal Stm is shifted from the power voltage level to the ground voltage level, the NOR gate NR61 keeps the output signal in logic "0" level, and, accordingly, the NOR gate NR63 recovers the output signal from logic "0" level to logic "1". Accordingly, the inverting circuit IN60 recovers the third controlling signal CNT3 from the power voltage level to the ground level as indicated by plots CNT3 of FIG. 5, and the n-channel type field effect transistor Qn61 turns off again.

When the voltage level at the node N31 goes up to the power voltage level again, the NOR gate NR62 keeps the output signal in logic "0" level. However, when the delay circuit DL31 shifts the timing signal Stm from the ground voltage level to the power voltage level Vcc, the delay circuit DL61 keeps the associated input node of the NOR gate NR61 in logic "0" for a while, and the inverting circuit IN61 immediately shifts the associated input node to logic "0" level. Then, the NOR gate NR61 shifts the output signal from logic "0" to logic "1", and the NOR gate NR63 shifts the output signal from the logic "1" to logic "0". With the output signal of logic "0", the inverting circuit IN60 shifts the third controlling signal CNT3 from the ground voltage level to the power voltage level Vcc, and the n-channel type field effect transistor Qn61 allows current to pass through the voltage level adjusting circuit 33b. This results in that the node N37 with the power voltage level Vcc discharges electric charges through the p-channel type field effect transistor Qp40 and the n-channel type field effect transistor Qn61 to the ground node, and the other electrode of the bootstrap capacitor C31 is decayed to the second predetermined voltage level.

Since the delay circuit DL61 shifts the associated input node of the NOR gate NR61 to logic "1" level, the NOR gate NR61 shifts the output signal from logic "1" level to logic "0" level again, and the NOR gate allows the inverting circuit IN60 to shift the third controlling signal CNT3 to the ground voltage level again. This as a result, the n-channel type field effect transistor Qn61 is turned off, and the voltage level adjusting circuit 33b is activated for a predetermined time period approximately equal to the delay time introduced by the delay circuit DL61.

The other circuit behavior of the second embodiment is similar to that of the first embodiment, and, for this reason, is not described for the sake of simplicity.

Third Embodiment

Figure 7:
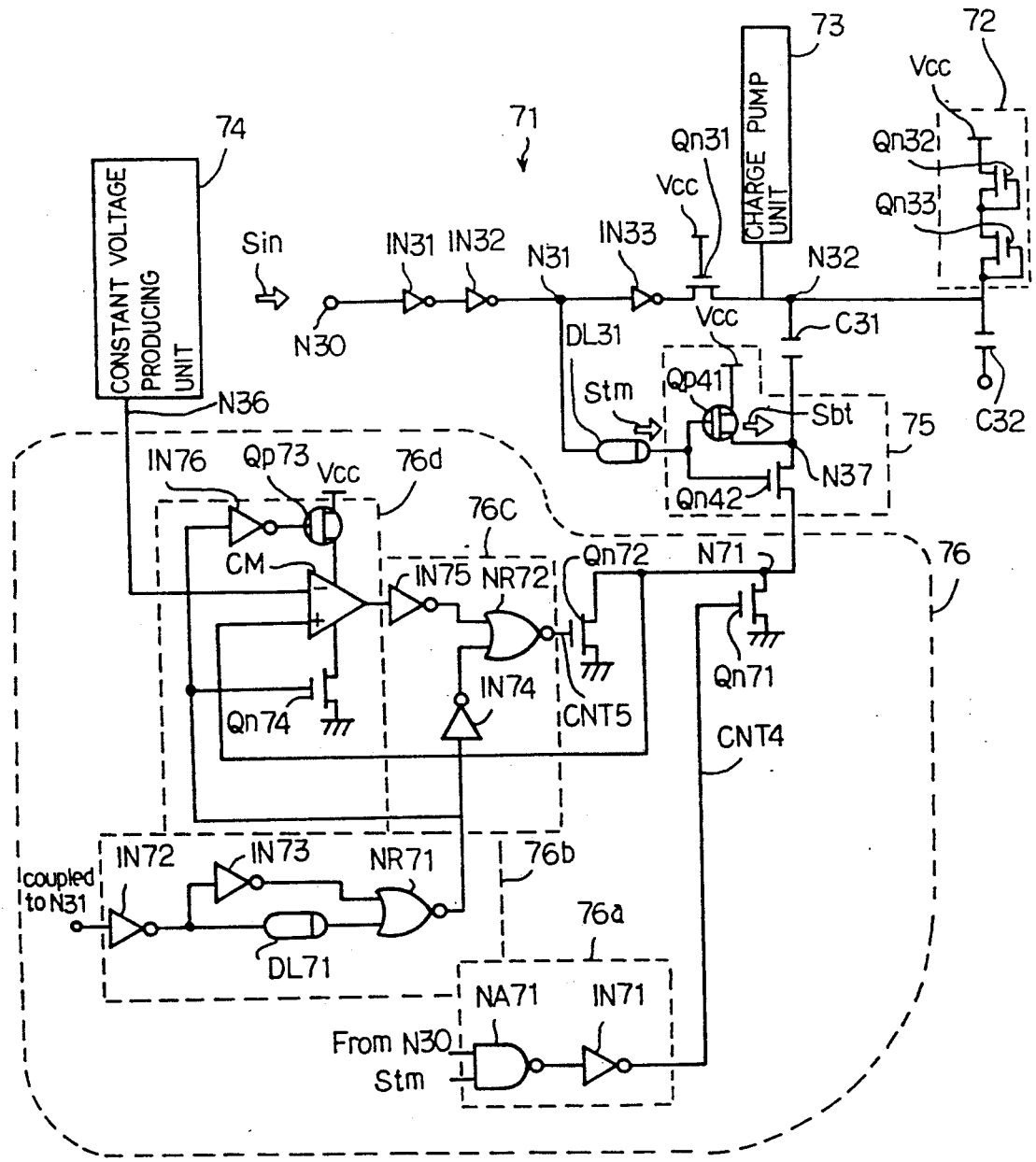
FIG. 7 is a circuit diagram showing the arrangement of still another bootstrap circuit according to the present invention.

Turning to FIG. 7 of the drawings, still another bootstrap circuit embodying the present invention largely comprises a bootstrap unit 71, a clamping unit 72, a charge pump unit 73, a constant voltage producing unit 74, a switching unit 75, and a controlling unit 76. The bootstrap unit 71, the clamping unit 72, the charge pump unit 73 and the switching unit 75 are similar in arrangement to the corresponding units 31, 32, 30 and 34, and, for this reason, the component elements of those units 61 to 73 and 75 are labeled with the same references used in FIG. 3 without any detailed description.

The constant voltage producing unit 74 is implemented by the voltage divider 33a, and the second predetermined voltage level (Vcc−4Vthn) is supplied from the common drain node N36 to the switching unit 75 through the controlling unit 76.

The series combination of the p-channel type field effect transistor Qp41 and the n-channel type field effect transistor Qn42 is coupled between the source of positive voltage level Vcc and a discharging node N71 which in turns is coupled through n-channel type field effect transistors Qn71 and Qn72 to the ground node. The n-channel type field effect transistor Qn71 is gated by a first discharging controller 76a implemented by a series combination of a NAND gate NA71 and an inverting circuit IN71, and the voltage level at the node N30 and the timing signal Stm are supplied to the two input nodes of the NAND gate NA71.

The controlling unit 76 further comprises a one-shot pulse generator 76b, a second discharging controller 76c, and a voltage controller 76d. The one-shot pulse generator 76b comprises inverting circuits IN72 and IN73, a delay circuit DL71 and a NOR gate NR71, and the second discharging controller 76c comprises two inverting circuits IN74 and IN75 and a NOR gate NR72. The voltage comparator 76d comprises a comparing circuit CM, a p-channel type field effect transistor Qp73, an n-channel type field effect transistor Qn74, and an inverting circuit IN76.

Figure 8:
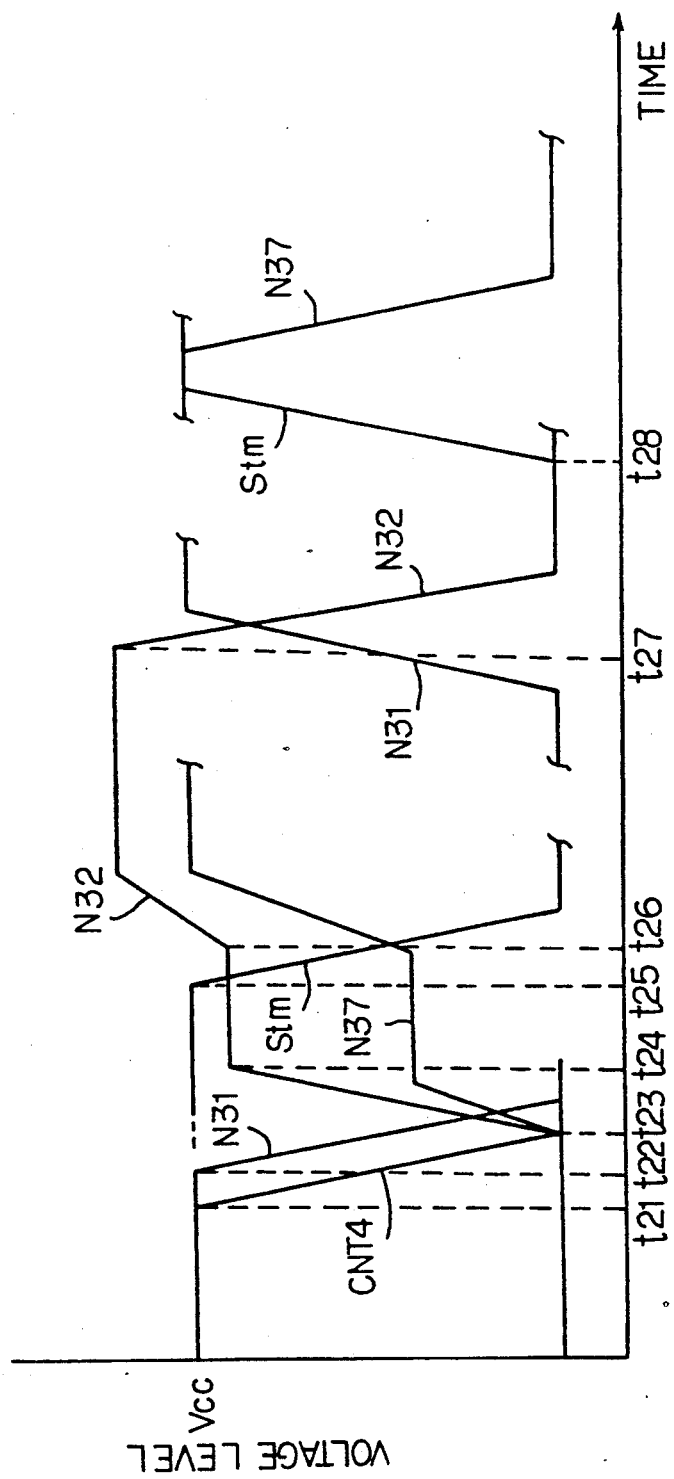
FIG. 8 is a diagram showing the waveforms of voltage levels at essential nodes in the bootstrap circuit shown in FIG. 7.

Description is made on the circuit behavior of the third embodiment with reference to FIG. 8. In the following description, logic "1" level and logic "0" level are assumed to be tantamount to the power voltage level Vcc and the ground voltage level. If the input signal Sin is decayed to the active low voltage level, the NAND gate NA71 starts on decay at time t21, because the delay circuit DL31 keeps the timing signal Stm in the power voltage level Vcc. The inverting circuit IN71 shifts a discharging signal CNT4 to the ground voltage level, and the n-channel type field effect transistor Qn71 turns off to block the switching unit 75 from the ground node. Although the timing signal of the power voltage level Vcc allows the n-channel type field effect transistor Qn42 to turn on, the nodes N71 and N37 enter a floating state.

the node N31 goes down to the ground voltage level at time t22, and the inverting circuit IN33 gradually accumulates one of the electrodes of the bootstrap capacitor C31 through the n-channel type field effect transistor Qn31. Then, the voltage level at the output node N32 starts on rising at time t23, and reaches (Vcc −Vthn) at time t24. The bootstrap capacitor C31 thus gradually accumulated allows the node N37 and the node N71 to go up through capacitive coupling.

When the node N31 goes down, the inverting circuit IN72 shifts the output signal to logic "1" level, and the inverting circuit IN73 shifts the output signal to logic "0" level. However, the delay circuit DL71 keeps the associated input node of the NOR gate NR71 in logic "0" level for a while, and the NOR gate NR71 shifts the one-shot pulse signal to logic "1" level, and the inverting circuit IN74 shifts the output signal to logic "0" level. The one-shot pulse signal and the complementary signal thereof produced by the inverting circuit IN76 allow the field effect transistors Qp73 and Qn74 to turn on to couple the comparing circuit CM to the source of power voltage level Vcc and the ground node. Then, the comparing circuit CM is activated, and compares the voltage level at the node N71 with the second predetermined voltage level. While the voltage level at the node N71 is lower than the second predetermined voltage level, the comparing circuit CM shifts the output signal thereof to logic "0" level, and the inverting circuit IN75 shifts the output signal thereof to logic "1" level. However, if the voltage level at the node N71 reaches the second predetermined voltage level, the comparing circuit shifts the output signal thereof to logic "1" level, and, accordingly, the inverting circuit IN75 shifts the output signal thereof to logic "0" level. Then, the NOR gate NOR 72 shifts the output signal thereof to the power voltage level, and the n-channel type field effect transistor Qn72 turns on to the couple the node N71 to the ground node. This results in that the node N71 does not go up anymore.

At time t25, the delay circuit DL31 decays the timing signal Stm, and the p-channel type field effect transistor Qp41 to turn on. However, the n-channel type field effect transistor Qn42 turns off. The booting signal Sbt is supplies to the other electrode of the bootstrap capacitor C31, and the output node N32 starts on rising again at time t26.

If the input signal Sin goes up again, the node N31 also goes up, and the inverting circuit IN33 decays the output voltage level at the output node N32 at time t27. However, the timing signal Stm of the ground voltage level causes the NAND gate NA71 to keep the output signal thereof in logic "1" level, and the inverting circuit IN71 causes the n-channel type field effect transistor Qn71 to turn off. At time t28, the timing signal Stm goes down to the ground voltage level, and the NAND gate NA71 shifts the output signal thereof to logic "0" level, and the inverting circuit IN71 allows the output signal thereof to go up the power voltage level. Then, the n-channel type field effect transistor Qn71 to turn on to pull down the node N71 and N37. In this instance, since the voltage level of the n-channel type field effect transistor Qn72 is large enough to discharge the node N71 and N37, and the transistor size is decreased to minimize the occupation area.

Although particular embodiments of the present invention have been shown and described, it will be obvious to those skilled in the art that various changes and modifications may be made without departing from the spirit and scope of the present invention. For example, the channel conductivity of the component field effect transistors may be altered to one another.

What is claimed is:

1. A bootstrap circuit comprising
   a) an input node which receives an input signal, the input node remaining in a low voltage level in the absence of the input signal;
   b) an output node;
   c) a bootstrap unit supplied from the input node with the input signal and including a bootstrap capacitor having first and second electrodes and a load capacitor coupled to the output node wherein the first electrode of the bootstrap capacitor is coupled to the output node and the bootstrap unit is responsive to a booting signal supplied to the second electrode of the bootstrap capacitor for bootstrapping an output voltage at the output node over a power voltage to a first predetermined level
   d) a constant voltage source operative to produce a second predetermined voltage level higher than the low voltage level and lower then the booting signal; and
   e) a switching unit coupled to the constant voltage source and to the bootstrap unit, said switching unit being operative to supply the booting signal to the second electrode of the bootstrap capacitor in the presence of the input signal and to feed the second predetermined voltage level to the second electrode of the bootstrap capacitor in the absence of the input signal.

2. A bootstrap circuit as set forth in claim 1, in which said bootstrap unit further comprises a plurality of inverting circuits coupled in series and supplied with said input signal, a first inverting circuit and a first delay circuit coupled in parallel to said plurality of inverting circuits, and a first transistor of a first channel conductivity type coupled between an output node of said first inverting circuit and the output node and having a gate electrode supplied with to power voltage level, said first delay circuit producing a timing signal.

3. A bootstrap circuit as set forth in claim 2, in which said constant voltage source comprises:
   a voltage divider coupled between a source of the power voltage level and a source of the lower voltage level for producing first and second controlling signals with a predetermined difference voltage and
   a voltage level adjusting circuit coupled between the source of the power voltage level and the source of the low voltage level and comprising a series combination of a second transistor of the first channel conductivity type and a third transistor of a second channel conductivity type opposite to the first channel conductivity type, the second and third transistors being gated by the first and second controlling signals, respectively, the second predetermined voltage level being produced at a first common drain node of the second and third transistors.

4. A bootstrap circuit as set forth in claim 3, in which said voltage divider comprises:
   a plurality of transistors of the first channel conductivity type coupled in series between the source of the power voltage level and a second common drain node,
   a fourth transistor of the second channel conductivity type coupled to the second common drain node,
   a first resistor coupled between the fourth transistor and the source of the low voltage level, and
   a second resistor coupled between the second common drain node and the source of the low voltage level,
   said plurality of transistors having respective gate electrodes respectively to source nodes and the second common drain node producing a certain voltage level approximately equal to the second predetermined voltage level.

5. A bootstrap circuit as set forth in claim 4, in which said switching unit comprises:
   a series combination of a fifth transistor of the second channel conductivity type and a sixth transistor of the first channel conductivity type coupled between the source of the power voltage level and the first common drain node, said timing signal being produced at a third common drain node of the fifth and sixth transistors, the third common drain node being coupled to the second electrode of said bootstrap capacitor and the booting signal being supplied from the fifth transistor.

6. A bootstrap circuit as set forth in claim 5, in which said bootstrap circuit further comprises a charge pump unit coupled to the output node for supplementing electric charges.

7. A bootstrap circuit as set forth in claim 6, in which said bootstrap circuit further comprises a clamping unit coupled to the output node for restricting the output voltage level to the first predetermined voltage level.

8. A bootstrap circuit as set forth in claim 2, in which said constant voltage source comprises:
   a voltage divider coupled between a source of the power voltage level and a source of the lower voltage level for producing first and second controlling signals with a predetermined difference voltage and
   a voltage level adjusting circuit coupled at one end to the source of the power voltage level and comprising a series combination of a second transistor of the first channel conductivity type and a third transistor of a second channel conductivity type opposite to the first channel conductivity type, the second and third transistors being gated by the first and second controlling signals, respectively, the second predetermined voltage level being produced at a first common drain node of the second and third transistors, and
   in which said bootstrap circuit further comprises a controlling unit including:
   a fourth transistor of the first channel conductivity type coupled between the third transistor and the source of the low voltage level, the fourth transistor being gated by a third controlling signal, and
   a first one-shot pulse generating circuit for producing the third controlling signal for a predetermined time period upon application of the input signal to the input node and upon removal of the input signal from the input node.

9. A bootstrap circuit as set forth in claim 8, in which said first one-shot pulse generating circuit comprises:
   a second inverting circuit having an input node supplied with the timing signal,
   a second delay circuit having an input node supplied with the timing signal,
   a first NOR gate having input nodes coupled to an output node of said second inverting circuit and an output node of said second delay circuit,
   a third inverting circuit having an input node coupled to a node between said plurality of inverting circuits and said first inverting circuit,
   a fourth inverting circuit having an input node coupled to an output node of said third inverting circuit,
   a third delay circuit having an input node coupled to the output node of the third inverting circuit,
   a second NOR gate having input nodes coupled to an output node of the fourth inverting circuit and an output node of the third delay circuit,
   a third NOR gate having input nodes coupled to output nodes of the first and second NOR gates, and
   a fifth inverting circuit having an input node coupled to an output node of the third NOR gate for producing the third controlling signal at an output node.

10. A bootstrap circuit as set forth in claim 1, in which said bootstrap circuit further comprises a charge pump unit coupled to said output mode for supplementing electric charges.

11. A bootstrap circuit as set forth in claim 1, in which said bootstrap circuit further comprises a champing unit coupled to said output node for restricting said output voltage level to the first predetermined volgate level.

12. A bootstrap circuit comprising:
   a) an input node and an output node;
   b) a bootstrap unit having:
   a plurality of inverting circuits coupled in series and supplied with an input signal from the input node,
   a first inverting circuit and a first delay circuit coupled in parallel to the plurality of inverting circuits, the first delay circuit producing a timing signal,
   a first transistor of a first channel conductivity type coupled between an output node of the first inverting circuit and the output node and having a gate electrode supplied with a power voltage level,
   a bootstrap capacitor having first and second electrodes, the first electrode being coupled to the output node, and
   a load capacitor coupled to the output node;
   c) a constant voltage source having a voltage divider for producing a constant voltage level;
   d) a switching unit responsive to the timing signal for supplying a booting signal to the second electrode of the bootstrap capacitor in the presence of the input signal; and
   e) a controlling unit having:
   first and second discharging transistors of the first channel conductivity type coupled in parallel between the switching unit and a source of ground voltage level and gated by first and second discharging signals, respectively,
   a first discharging controller for producing the first discharging signal upon removal of the timing signal, a one-shot pulse generator for producing a one-shot pulse signal upon application of the input signal to the input node, a voltage comparator operative to compare a voltage level at a drain node of the first discharging transistor with the constant voltage level and produce an enabling signal when the voltage level at the drain node exceeds the constant voltage level, and a second discharging controller enabled by the enable signal and producing the second discharging signal in the presence of the one-shot pulse signal.

13. A bootstrap circuit as set forth in claim 12, in which the first discharging controller comprises a series combination of a NAND gate and a second inverting circuit, the input signal and the timing signal being supplied to the NAND gate.

14. A bootstrap circuit as set forth in claim 13, in which the one-shot pulse generator comprises:

a third inverting circuit having an input node coupled to a node between the plurality of inverting circuits and the first inverting circuit, an fourth inverting circuit having an input node coupled to an output node of the third inverting circuit, a second delay circuit having an input node coupled to the output node of the third inverting circuit, and a first NOR gate having input nodes coupled to an output node of the fourth inverting circuit and an output node of second delay circuit for producing the one-shot pulse signal.

15. A bootstrap circuit as set forth in claim 14, in which said voltage comparator comprises:

a comparator circuit supplied with the constant voltage level and the one-shot pulse signal, a first switching transistor of the second channel conductivity type coupled between the source of the power voltage level and a first power voltage node of the comparator circuit, a fifth inverting circuit having an input node supplied with one-shot pulse signal for gating the second switching transistor, and a second switching transistor of the first channel conductivity type which is coupled between a second power voltage node of the comparator circuit and a source of ground voltage and which is gated by the one-shot pulse signal.

16. A bootstrap circuit as set forth in claim 15, in which the second discharging controller comprises a sixth inverting circuit having an input node coupled to an output node of the comparator circuit and a seventh inverting circuit having an input node supplied with the one-shot pulse signal, and a second NOR gate having input nodes coupled to output nodes of the tenth and eleventh inverting circuits for producing the second discharging signal.

17. A bootstrap circuit as set forth in claim 12, in which said bootstrap circuit further comprises a charge pump unit coupled to the output node for supplementing electric charges.

18. A bootstrap circuit as set forth in claim 12, in which said bootstrap circuit further comprises a clamping unit coupled to the output node for restricting the output voltage level.

19. A bootstrap circuit as set forth in claim 1, wherein the bootstrap unit is adapted to vary the voltage at the output node in proportion to the power voltage level.

* * * * *

UNITED STATES PATENT AND TRADEMARK OFFICE
CERTIFICATE OF CORRECTION

PATENT NO. : 5,184,035

DATED : February 2, 1993

INVENTOR(S) : Tadahiko Sugibayashi

It is certified that error appears in the above-identified patent and that said Letters Patent is hereby corrected as shown below:

On the title page:

Item no. [56], References Cited, change "4,617,476 2/1986 Redfield 307/482" to --4,570,085 2/1986 Redfield 307/453--.

Item no. [57], Abstract, line 1, after "circuit" insert --associated--.

Claim 2, col. 10, line 49, change "to" to --the--.

Claim 4, col. 11, line 15, after "respectively" insert --coupled--.

Signed and Sealed this

Ninth Day of November, 1993

BRUCE LEHMAN

Attest:

Attesting Officer

Commissioner of Patents and Trademarks